United States Patent [19]

Yamaguchi et al.

[11] Patent Number: 4,933,565
[45] Date of Patent: Jun. 12, 1990

[54] METHOD AND APPARATUS FOR CORRECTING DEFECTS OF X-RAY MASK

[75] Inventors: Hiroshi Yamaguchi, Fujisawa; Keiya Saito, Yokohama; Mitsuyoshi Koizumi, Yokohama; Akira Shimase, Yokohama; Satoshi Haraichi, Yokohama; Tateoki Miyauchi, Yokohama; Shinji Kuniyoshi, Tokyo; Susumu Aiuchi, Yokohama, all of Japan

[73] Assignee: Hitachi, Ltd., Tokyo, Japan

[21] Appl. No.: 216,834

[22] Filed: Jul. 8, 1988

[30] Foreign Application Priority Data

Jul. 10, 1987 [JP] Japan .................................. 62-170905

[51] Int. Cl.⁵ .............................................. H01J 37/08
[52] U.S. Cl. .................................. 250/492.2; 250/309
[58] Field of Search ................ 250/492.21, 442.1, 309; 430/5; 378/35

[56] References Cited

U.S. PATENT DOCUMENTS

| | | | |
|---|---|---|---|
| 4,503,329 | 3/1985 | Yamaguchi et al. | 250/492.21 |
| 4,609,809 | 9/1986 | Yamaguchi et al. | 250/492.2 |
| 4,623,256 | 11/1986 | Ikanaga et al. | 356/394 |
| 4,683,378 | 7/1987 | Shimase et al. | 250/492.21 |
| 4,696,878 | 9/1987 | Shimkunas | 378/35 |
| 4,748,327 | 5/1988 | Shimozaki et al. | 250/358.1 |
| 4,751,169 | 6/1988 | Behringer et al. | 378/35 |

FOREIGN PATENT DOCUMENTS

| | | |
|---|---|---|
| 1090149 | 12/1985 | European Pat. Off. . |
| 0168056 | 1/1986 | European Pat. Off. . |
| 1109375 | 4/1988 | European Pat. Off. . |
| 56332 | 4/1983 | Japan . |

Primary Examiner—Bruce C. Anderson
Attorney, Agent, or Firm—Fay, Sharpe, Beall, Fagan, Minnich & McKee

[57] ABSTRACT

The present invention relates to a method and apparatus for correcting defects of an X-ray mask which includes a focused ion beam used to irradiate at least a region having a defective portion of an X-ray mask having a protective film and eliminating the protective film; exposing a circuit pattern having a defective portion located under the region or setting this circuit pattern to the state near the exposure; detecting one of the secondary electrons, secondary ions, reflected electrons, or absorbing current generated from that region and detecting a true defective position. Then positioning the focused ion beam to the true defective position and irradiating the focused ion beam to the defective portion thereby correcting the defect.

11 Claims, 11 Drawing Sheets

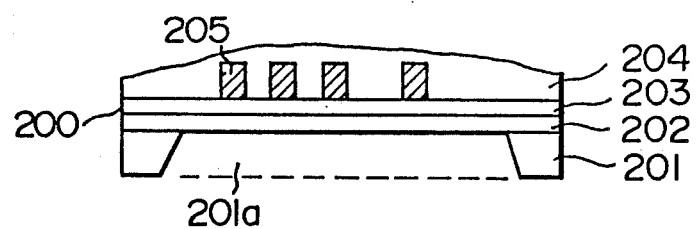
FIG. 1
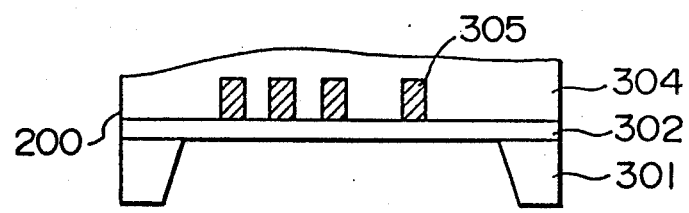
FIG. 2
FIG. 3(a) 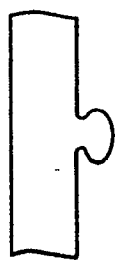 → FIG. 3(b) 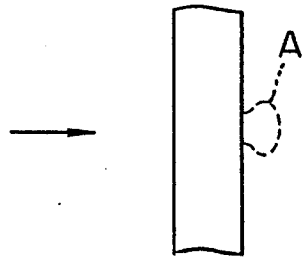
FIG. 3(c) 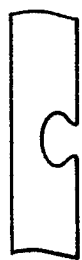 → FIG. 3(d) 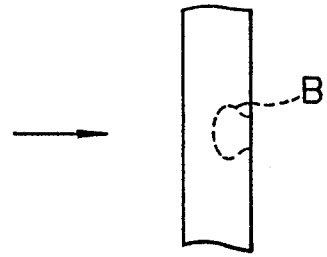

METHOD AND APPARATUS FOR CORRECTING DEFECTS OF X-RAY MASK

BACKGROUND OF THE INVENTION

The present invention relates to a method and apparatus for working an X-ray mask in which in an X-ray mask or the like is used in X-ray lithography or the like. A focusing ion beam which works a product covered with a protective film is positioned with a high degree of accuracy to a defect or the like, thereby eliminating the defect of the product.

In recent years, in association with the realization of a high integration in a semiconductor integrated circuit, an X-ray exposing method is used to form a fine pattern. According to this method, an Si wafer or the like coated with a resistive material adapted to be photo-sensitive to the X-ray is exposed by use of an X-ray mask which is constructed by forming a circuit pattern of heavy metal on a thin supporting material (membrane). Since the wavelength of an X-ray is extremely shorter than that of the light, a accurate circuit pattern can be formed and the X-ray is also superior to an electron beam exposure method or the like with respect to the mass productivity. FIGS. 1 and 2 show arrangements of a mask 200 for X-ray exposure (hereinafter, referred to as an "X-ray mask"). In FIG. 1, a thin film membrane (supporting material) 202 made of BN (boron nitride) or the like is formed on an Si wafer (holder) 201 from which a portion 201a was removed. A plating electrode 203 is formed on the membrane 202 and an insulative film for plating stencil (negative form) is formed. Thereafter, this insulative film is eliminated by a dry etching. After that, a circuit pattern 205 is formed by plating. A protective film 204 is coated on the electrode 203 and circuit pattern 205. In this manner, the mask 200 is formed. The central portion of the Si wafer 201 is eliminated by etching, thereby forming the hole 201a so as to enable the X-ray to be transmitted.

FIG. 2 shows another example. A thin film (supporting material) 302 made of silicon nitride or the like is coated onto an Si substrate (holder) 301 having a hole in the central portion. A heavy metal layer is formed on the thin film 302. Thereafter, a circuit pattern 305 is formed by dry etching. A protective film 304 is coated on the thin film 302 and circuit pattern 305.

The reason why the final product of the X-ray mask is formed by coating the protective film 204 or 304 is because in the X-ray exposure, the secondary electrons or Auger electrons which are generated when the X-ray is irradiated onto the circuit pattern 205 or 305 are absorbed by the protective film 204 or 304 so as not to be irradiated onto the wafer, thereby enabling a fine circuit pattern to be exposed and formed at a high accuracy. In addition, the protective films 204 and 304 also obviously protect the circuit patterns 205 and 305 from external stress. On the other hand, if the defects were corrected and eliminated before the protective film 204 or 304 is coated and formed, defects are caused due to the mixture of foreign matters when the protective film 204 or 304 is formed. FIG. 3 shows an example of a defect. In the diagram, (a) shows a black dot defect (opaque defect) caused when an additional pattern was deposited to a normal circuit pattern. (c) shows a blank defect (pin hole defect) caused when a normal circuit pattern was notched. If such a defective circuit pattern is directly copy transferred, this will soon result in a defect of the circuit pattern of an LSI. To prevent this drawback, the defect needs to be corrected at the stage of the copy transferring process (exposure process) of the X-ray mask as shown in (b) and (d) in FIG. 3.

However, the circuit patterns 205 and 305 of the X-ray masks are so fine that have the widths of 0.5 μm or less. Moreover, their heights are set to large values of 0.5 μm or higher in order to absorb the X ray. Hitherto, the black dot defect has been corrected by performing a laser work to the photo mask. However, it is difficult to correct defects of such a fine pattern due to the fact that such work is done by a laser and is thermal work, and there is a focusing limitation of the laser beam due to the diffraction, and the like. Therefore, in a recent correcting method, such defects are corrected by irradiating a focused ion beam on the order of submicrons as disclosed in JP-A-58-56332.

The foregoing conventional technique is insufficient in terms of the detection of the pattern and defects covered by the protective film as in the X-ray mask and LSI. That is, in the X-ray mask, LSI, or the like, a protective film made of polyimide or the like is generally formed onto an absorber pattern so as to flatten it is shown in FIGS. 1 and 2. An ion beam is scanned and irradiated onto this sample and the secondary electrons or secondary ions which are generated from the sample are detected. Only the roughness (concave and convex portions) of the surface is detected by a scanning ion image which is displayed on the display by modifying the intensity of the spot scanned synchronously with a scan signal in proportion to the intensity of the secondary electrons or ions obtained. This is because the projection range of an ion beam used is so short, about 1000 Å or less and only the information of the surface is derived. Thus, there is a problem such that it is hard to detect the fine pattern and defects from over such a protective film and it is fairly difficult to correct them.

In addition, as conventional techniques, there have been known U.S. Pat. No. 4,683,378, EPC Application No. 85108708.0 (laid-open No. 0168056), and U.S. Pat. No. 4,503,329, EPC Application No. 82109014.9 (laid-open No. 0075949).

SUMMARY OF THE INVENTION

It is an object of the present invention to provide method and apparatus for working an X-ray mask in which with respect to the X-ray mask having a pattern covered by a protective film, a fine circuit pattern, defects, and the like are detected by irradiating a focused ion beam to them without damaging this circuit pattern, the focused ion beam can be accurately positioned to the defective portion, and thereby enabling the defective portion to be corrected.

To accomplish the above object, according to the present invention, there is provided a method of correcting defects of an X-ray mask in which a focused ion beam is irradiated to at least the region having a defective portion of an X-ray mask having a protective film, the protective film is eliminated, the circuit pattern having the defective portion located under this region is exposed or set to a state near the exposed state. At least one of the secondary electrons, secondary ions, reflected ions, and an absorbing current generated from that region is detected or an SEM image is detected, thereby detecting the true defective position, and the focused ion beam is positioned to this true defective position, thereby correcting the defects.

The lower layer pattern is exposed or set to a state near the exposed state, by working (sputtering) the wide region having the defective portion on the X-ray mask having the protective film by irradiating a focused ion beam, thereby enabling the true defective position to be detected by the secondary electron image, secondary ion image, or SEM image from this portion, and thereby enabling the true defective position on the X-ray mask having the protective film to be detected and also enabling the defects to be corrected.

When the circuit pattern of the lower layer is exposed, the sputtering rate is generally so high that the X-ray mask is promptly worked. Therefore, by detecting a current generated by the ion beam which is absorbed to the X-ray mask, the working can be stopped when the circuit pattern is exposed by previously forming a material having a low sputtering rate onto the circuit pattern, and the true defective position can be detected.

Hitherto, when the width of the Au circuit pattern of the X-ray mask is 0.5 μm and the minimum defect is so fine to be 0.1 μm, the defective portion can be hardly detected with the resolution of the optical microscope. However, according to the invention, the ion beam is positioned to the defective portion at a high accuracy without working the normal Au circuit pattern, and only the defective portion is eliminated and corrected by the ion beam. That is, the invention is accomplished by constituting the detecting section to detect the Au pattern of the X-ray mask and the positioning section to position the defective portion of the Au pattern on the basis of the detected image in the following manner.

The detecting section is constituted by an electron microscope includes, an electron gun to emit electrons; an electron lens to thinly focus an electron beam emitted from the electron gun; a deflector to two-dimensionally scan the electron beam on an X-ray mask; a secondary electron detector to detect the secondary electrons generated from the X-ray mask surface by the incident electron beam; and a controller for luminance modulating the CRT by using a signal of the secondary electron detector as a video signal and for scanning on the CRT synchronously with the deflector.

The positioning section includes, an SEM image memory to store the video signal by the secondary electrons from the detecting section as a scanning electron microscope image (hereinafter, referred to as an SEM image); an SIM image memory to store the signal from the secondary electron detector of the ion beam working machine as an SIM image (scanning ion microscope image); a position deciding circuit to decide the defective position by use of the signals which are obtained from both of those memories; and a positioning controller for controlling each element of the positioning device and positioning section to designate the defective position from the image in which defects are displayed and which is obtained from the position deciding circuit.

First, about 90% of the thickness of the protective film (polyimide isoindroquinazoline-dione) is worked and eliminated. The resultant SIM image mainly consisting of the working hole is stored into an SIM image memory. At this time, at least the edge information of the working hole needs to be stored.

Next, the Au pattern is detected by the detecting section. That is, in the detecting section, the electrons emitted from the electron gun are focused by an electron lens. The PIQ working portion of the X-ray mask is scanned by the focused electron beam by use of a deflecting coil. The secondary electrons obtained from the surface of the X-ray mask are detected, thereby obtaining a secondary electron image. This image is stored into the SEM image memory in the positioning section. In this case, the SEM image is formed by the secondary electrons from the Au pattern under the thin PIQ since the electrons of the scanning electron beam enter the sample deeper than the ions of the ion beam. Thus, the shape of the Au pattern can be obtained.

Therefore, in the positioning section, the edges of the working hole are detected with regard to each of the SIM image and SEM image and the positional deviation between these images is calculated. The SEM image is corrected by the amount corresponding to the positional deviation and superposed to the SIM image, so that the image in which the defective portion of the Au pattern is displayed is derived.

The defective portion is designated by the positioning device by use of a cursor line or the like and the working range is designated to the deflector controller.

In this manner, the fine pattern and its defects which are out of the detection limit in the case of the detection using the light can be detected without working the Au pattern. The defective portion can thereby be positioned at a high precision.

BRIEF DESCRIPTION OF THE DRAWINGS

FIGS. 1 and 2 are cross sectional views showing structures of X-ray masks;

FIGS. 3(a) to 3(d) are diagrams showing a black point defect and a blank point defect of a circuit pattern in the X-ray mask;

DESCRIPTION OF THE PREFERRED EMBODIMENTS

Figure 4A:
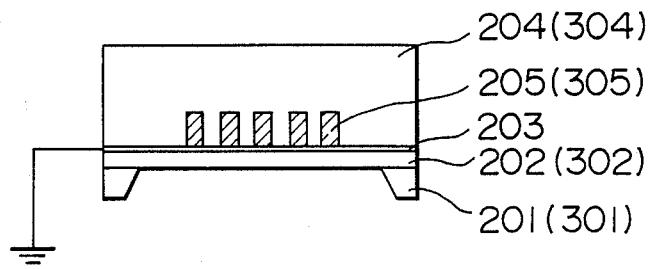
FIGS. 4A–4D show an X-ray mask being worked.
Figure 5:
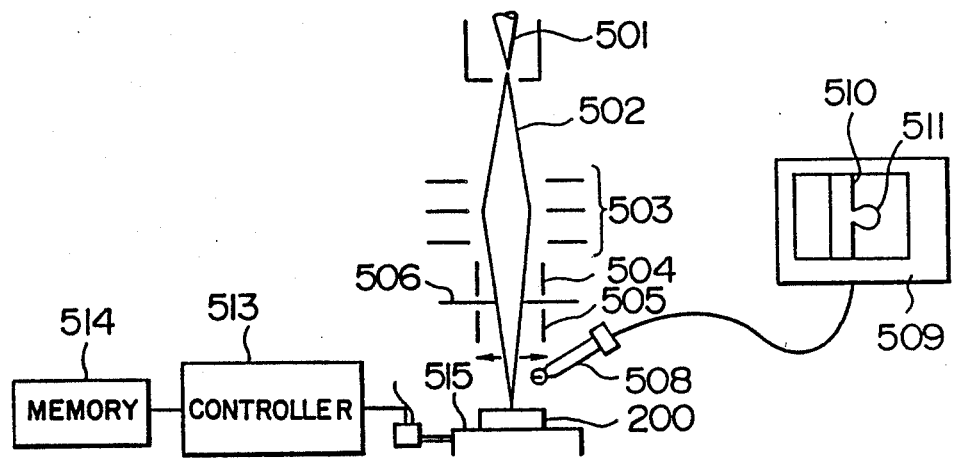
FIG. 5 is a diagram showing an embodiment of an apparatus for embodying the invention.
Figure 6A:
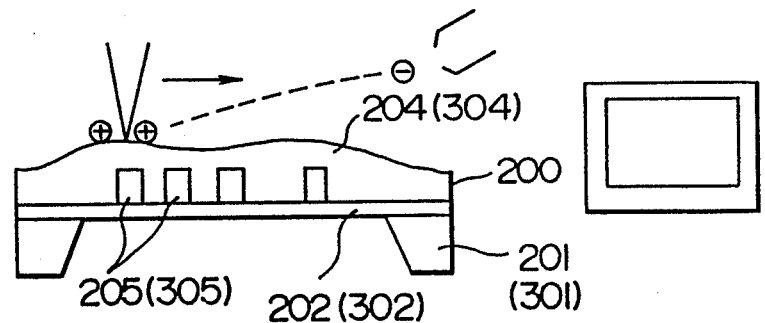
FIGS. 6A and 6B are diagrams showing a state when a focused ion beam is irradiated onto the X-ray mask and a screen which is displayed on a monitor.
Figure 6B:
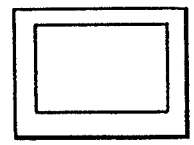

The present invention will now be described hereinbelow with respect to an embodiment shown in the diagrams. FIG. 5 shows an embodiment of the invention. An ion beam emitted from a liquid metal ion source 501 is focused by an electrostatic lens 503. The focused ion beam is then deflected by a blanking electrode 504, a blanking aperture 506, and a deflecting electrode 505 and irradiated onto the X-ray mask 200. At this time, the secondary charged particles (secondary electrons, secondary ions, or the like) emitted from a sample are captured by a detector 508 and a resultant scanning ion image is displayed on a display 509. If no protective film is formed on the pattern in the X-ray mask 200, a normal pattern 510 and a defective pattern 511 are displayed on the display 509. However, in the case of the X-ray mask, as shown in FIG. 6A, the membranes 202 and 302 are formed on the holders 201 and 301 formed at the periphery. The circuit patterns 205 and 305 having widths of 0.5 μm and made of heavy metal such as Au or the like are formed on the membranes 202 and 302. The protective films 204 and 304 having thicknesses of about 2 μm and made of polyimide or the like are further formed on the membranes 202 and 302 and circuit patterns 205 and 305. The concave and convex portions of the circuit patterns 205 and 305 in the lower portions are not always reflected to the surfaces of the protective films 204 and 304. As shown in FIG. 6B, the circuit patterns 205 and 305 are not displayed on the display 509. Therefore, in the state shown in FIG. 4A, the X-ray mask 200 is set in an ion beam working machine. As shown in FIGS. 3(a), 3(c), if the region where a defect exists could be detected by using a transmission type electron microscope or the like as another defect checking apparatus, this detection data is stored in a memory 514. A controller 513 reads out the detection data from the memory 514 and drives a motor 512 to move a table 515, thereby positioning the region having the defect to the position onto which the focused ion beam is deflected and scanned.

Figure 4B:
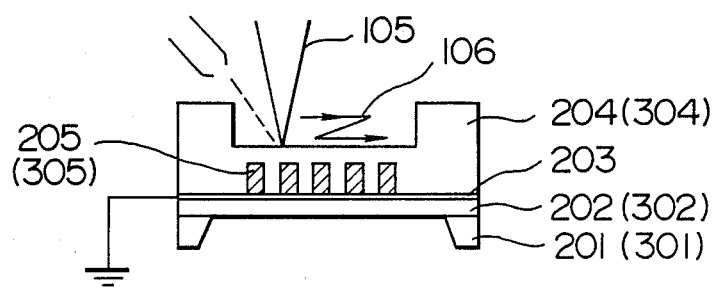
Figure 4C:
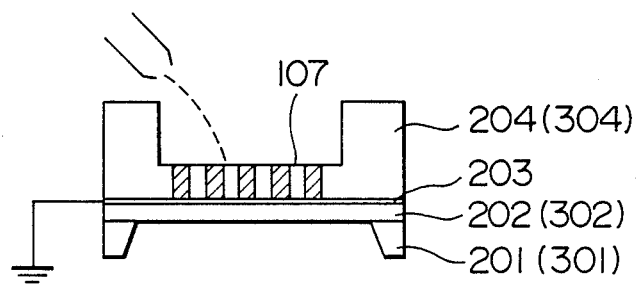
Figure 7A:
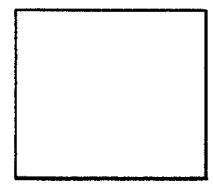
FIGS. 7A to 7C are diagrams showing images which are detected before and after a circuit pattern is exposed when an X-ray mask is worked.

Next, the ion beam working machine is made operative by a command from the controller 513. As shown in FIG. 4B, a slightly wider region is scanned and worked by the ion beam. When the circuit pattern 205 (305) of the lower layer is exposed, the display image changes from the state shown in FIG. 7A to the state shown in FIG. 7B. The circuit pattern 205 (305) is detected by the scanning ion image which is detected by the detector 508, thereby positioning the defective portion at a high precision. In this case, the circuit pattern 205 (305) of the X-ray mask of the sample image can be also detected not only by detecting the secondary electrons or secondary ions from the X-ray mask but also by detecting a current flowing to the plating electrode 203. In this case, the image which is obtained by processing the sample image based on those signals can be also used.

Figure 4D:
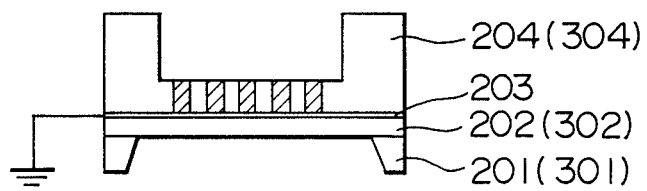
Figure 7B:
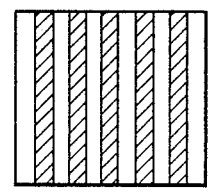
Figure 7C:
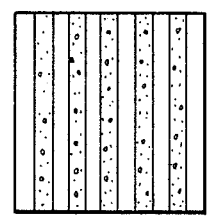

As shown in FIG. 4D, when the circuit pattern 205 (305) of the X-ray mask, e.g., the Au pattern is exposed, the sputtering rate of the metal pattern of the X-ray absorber is generally higher than that of the protective film 204 (304) (or stencil for plating) made of polyimide or the like. For example, in the case of Au, the working promptly advances so that the surface of Au is worked as shown in FIG. 4D. The image which is detected by the detector 508 becomes as shown in FIG. 7C. This means that the detection of the Au pattern itself causes a new defect and is a large problem.

Figure 8A:
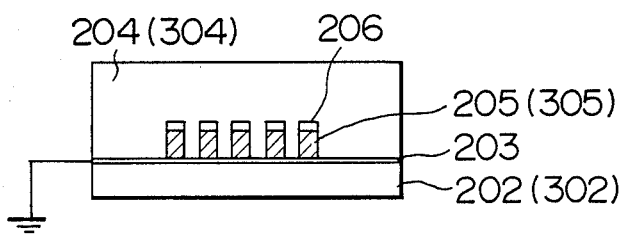
FIGS. 8A and 8B are diagrams showing a state in which a protective film is worked by an ion beam for an X-ray mask in which an etching stopper material is formed on a circuit pattern.
Figure 8B:
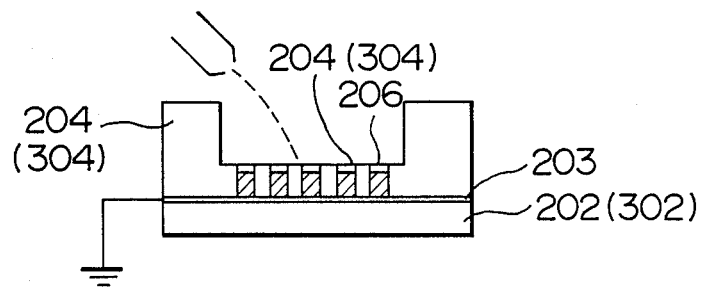

FIG. 8A shows an embodiment which can solve this problem. After a layer 205 (305) consisting of metal such as Au or the like having a high sputtering rate was formed by plating or the like, a film 206 consisting of metal such as Ta, W, or the like having a low sputtering rate is thinly formed onto the layer 205 (305) by plating or the like. This film 206 is performed as a stopper in the etching or sputtering process by irradiating an ion beam. By working these layers by an ion beam as shown in FIG. 4B, the circuit pattern 206 is exposed as shown in FIG. 8B. However, since the circuit pattern 206 is made of metal such as Ta, W, or the like having a low sputtering rate, it functions as a stopper material in the etching process. The ion beam working does not suddenly advance. In this case, the circuit pattern 206 is detected by the difference between the contrasts of the stopper material 206 and stencil 204 (304).

However, even in this case, so long as the detection is performed by using the SIM image, the circuit pattern of the X-ray mask is certainly eliminated by the irradiation of the primary ions. Therefore, the image obtained by the single scanning operation of the ion beam is stored into image storage means or the like, thereby avoiding scanning more than is needed.

Figure 9A:
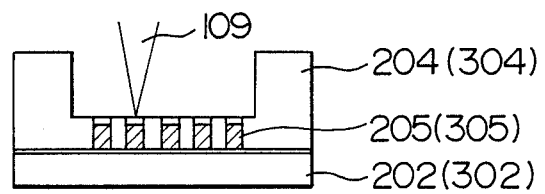
FIGS. 9A and 9B are diagrams showing the case where both of the ion beam working and the SIM image detection are together performed.
Figure 9B:
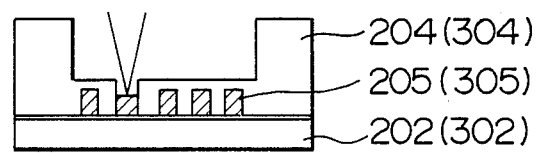

FIGS. 9A and 9B show another embodiment of the invention.

The working is performed by an ion beam 109. In this case, just before the absorber pattern (circuit pattern) is exposed, the irradiation of the ion beam is stopped by using the blanking electrode and blanking aperture by a method such as integration due to the measurement of the ion current, management of the working time, or the like.

For the X-ray mask, the secondary electron image is detected by the scanning electron microscope, thereby detecting the defective circuit pattern of the X-ray mask. In this case, in the scanning electron microscope, different from the ion beam, the electron beam which is irradiated deeply enters the X-ray mask. Therefore, even when the protective film made of polyimide or the like which is exposed on the surface of the X-ray mask remains, the primary electron beam enters the X-ray mask portion. The difference between the contrasts of the stencil 204 (304) and circuit pattern 205 (305) is obtained from the difference between the secondary electron emission rates, so that the circuit pattern as shown in FIG. 7B can be detected.

Therefore, the circuit pattern 205 (305) in the lower portion can be detected in the state shown in FIG. 9A without damaging the absorber circuit pattern 205 (305) by the ion beam. The ion beam can be positioned to the defective pattern. The table on which the mask is set is moved by a distance X between the irradiating central electron axis of the secondary electron microscope and the irradiating central beam axis of the ion beam working machine. By irradiating the ion beam to this portion, the defective portion can be corrected and worked as shown in FIG. 9B.

Figure 10:
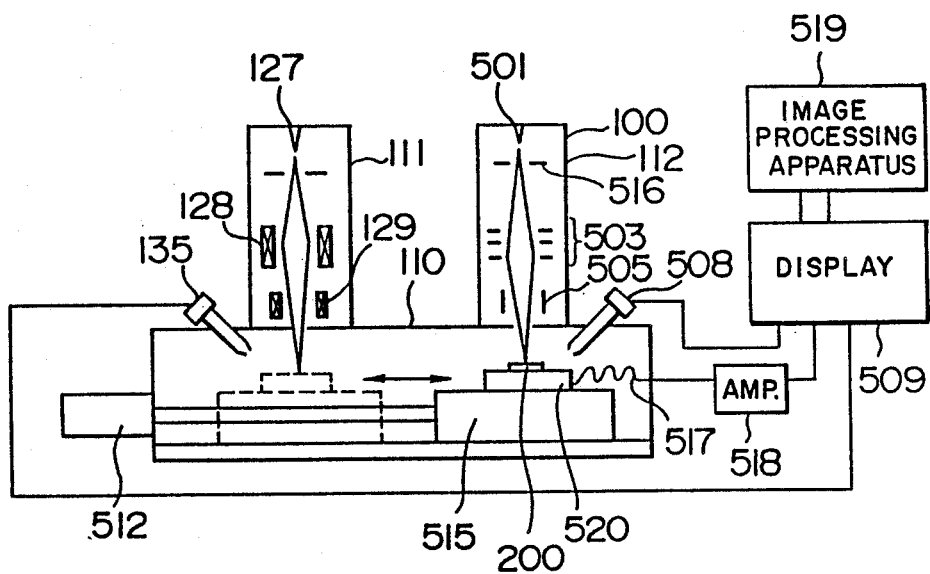
FIG. 10 is a schematic arrangement diagram showing an embodiment of an apparatus in which the ion beam working and the SIM image detection are performed.

FIG. 10 shows an embodiment of an apparatus for embodying the method shown in FIGS. 9A and 9B. This apparatus has both of an ion beam working machine 100 and a scaning type electron microscope 111 in a vacuum chamber 110. The ion beam is extracted by an extraction electrode 516 from the ion source 501 arranged in the upper portion of a column 112 of the ion beam working machine 100. This ion beam is focused by the electrostatic lens 503 and is deflected by the deflecting electrode 505 and is irradiated onto the sample (X-ray mask) 200 put on a sample (X-ray mask) holder 520, thereby working it. At this time, the secondary electrons or secondary ions generated from the sample (X-ray mask) 200 are detected by the secondary changed particle detector 508 and displayed on the display 509. On the other hand, an absorbing current which flows out of the plating electrode 203 of the sample (X-ray mask) can be extracted to the outside by a flexible wire 517 and amplified by an amplifier 518 and displayed by the display 509.

An image processing apparatus 519 inputs image displayed on the display 509 and processes it, thereby enabling the detection to be performed with high contrast and high resolution.

Figure 11:
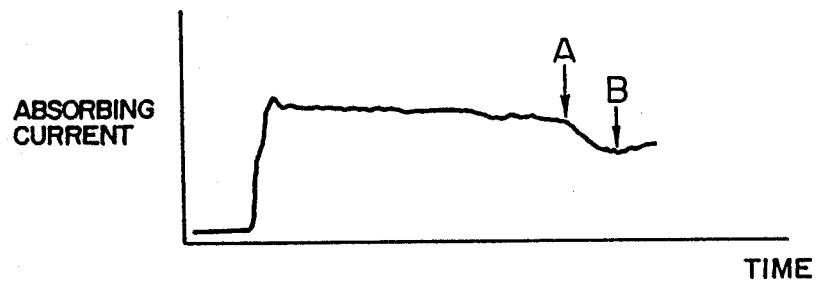
FIG. 11 is a diagram showing a change in absorbing current when a protective film of an X-ray mask is worked by an ion beam.

In this case, it is observed that the absorbing current from the plating electrode 203 changes as shown in FIG. 11 in accordance with the advancement of the working. As the result of the comparison between the current change and the working result, it has been found that point A indicates the state of the absorber circuit pattern 205 (305) when it is exposed and point B represents the state when the working of the circuit pattern 205 (305) is finished. Consequently, this current change is detected and when the circuit pattern 205 (305) is exposed, the working can be stopped.

Additionally, the sample (X-ray mask) 200 can be worked until such a state that the thin protective film of polyimide remains (as shown in FIG. 9A) due to the control of the working time or dose amount. Thereafter, the sample 200 is moved to the position of the SEM 111 and the SEM image is detected, thereby detecting the defective position. The defective pattern is once input to the image processing apparatus 519 through the display 509. The table 515 is returned by a predetermined distance to the central position of the ion beam column 112 of the ion beam working machine 100 by again driving the motor 512. The ion beam is irradiated onto this defective portion and can be corrected and worked. The defective pattern is once input to the image processing apparatus 519 through the display 509, the motor 512 is driven, and the table. Thus, the sample (X-ray mask) 200 is positioned so as to arrive at the location below the column 112 of the ion beam working machine 100. The SEM image stored in the image processing apparatus 519 is taken out and the defective position is detected together with the SIM image detected by the ion beam working machine 100. The defect is corrected by irradiating the ion beam to the defective portion. Thus, only the defect can be corrected without exerting an adverse influence on the portions other than the defective portion.

Further, a protective film of polyimide or the like needs to be formed to the region worked by the ion beam including this defective portion by a plasma CVD method or the like.

Figure 12A:
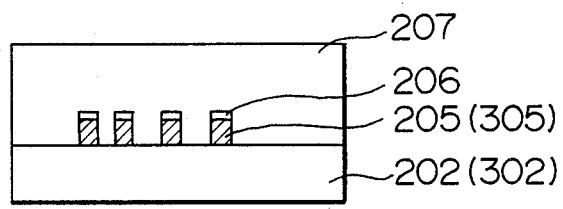
FIGS. 12A to 12C are diagrams showing an embodiment which enables the detection with a good contrast to be executed for an X-ray mask.
Figure 12B:
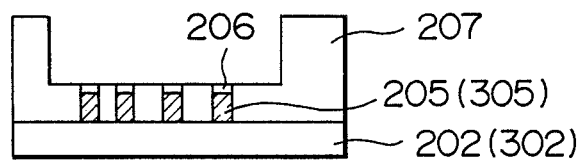
Figure 12C:
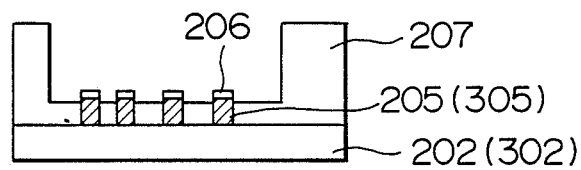

FIGS. 12A to 12C show another embodiment which can detect at a good contrast. As shown in FIG. 12A, the etching stopper material 206 is formed on the circuit pattern 205 (305) in the same manner as the foregoing embodiment. As shown in FIG. 12B, after working until the stopper material 206 is exposed, the working is further executed. Thus, a protective film (stencil) 207 is worked further than the stopper material 206 as shown in FIG. 12C due to the difference between the sputtering rates of the stopper material 206 and dry etching resistive material (or plating stencil material) 207, so that a level difference is caused. Due to this level difference, the secondary electrons or secondary ions are easily emitted from the upper surfaces and edge portions of the level difference portions as compared with the bottom portions. Therefore, the circuit pattern 205 (305) having a higher contrast can be detected as compared with the case where no level difference exists.

Figure 13A:
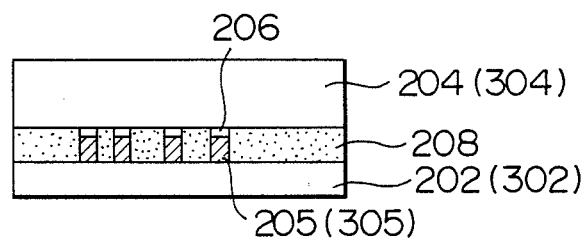
FIGS. 13A and 13B are diagrams showing another embodiment different from FIGS. 12A to 12C.
Figure 13B:
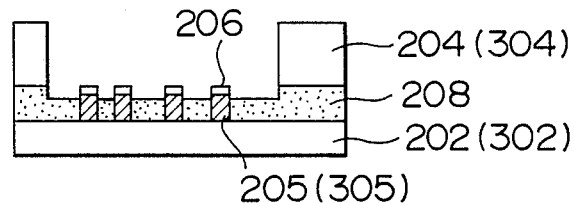

FIGS. 13A and 13B show a method of improving the detection contrast by making the level difference in a manner similar to the above. As shown in FIG. 13A, this method is characterized in that the working advances rapidly by use of a material having a high sputtering rate as the dry etching resistive material (or plating stencil material).

Next, the embodiment shown in FIG. 10 will now be further practically explained with reference to FIG. 14.

The ion beam working machine shown in FIG. 14 includes, the ion beam working section 100 to work the protective film (polyimide isoindroquinazoline-dione) and Au pattern of the X-ray mask; the detecting section 111 to detect the Au pattern of the X-ray mask; and the positioning section (image processing apparatus) 519 to position the defective portion of the Au pattern.

Working section

The ion beam working section includes the liquid metal ion source 501 of a high luminance; the extraction electrode 516 to extract the ions from the ion source 501; the electrostatic type lens electrode 503 to focus an extracted ion beam 143; a blanking electrode 104 to turn on and off the ion beam 143; a blanking aperture 105; the electrostatic type deflector 505 to scan the ion beam 43 onto the X-ray mask 200 to be worked; the secondary electron detector 508 for capturing the secondary electrons emitted from the surface of the X-ray mask 200 and converting into the electric signal; an X stage 108 and a Y stage 109 for positioning the X-ray mask 200 to the ion beam optical system; the moving table 515 which moves the X-ray mask 200 to the detecting section when the Au pattern of the X-ray mask 200 is detected; an ion source controller 122 to optimize the extraction of the ions; an extraction electrode controller 123 to control the voltage of the extraction electrode to extract the ions; a lens electrode controller 124 to control the voltage of the lens electrode 503 to focus the ions; a blanking controller 125 to apply the voltage of the blanking electrode 104 to turn on and off the ion beam 143; a deflector controller 126 to control the deflector to two-dimensionally scan the ion beam 43; an SIM Image display controller 137 for amplifying the signal of the secondary electrons and displaying as an SIM image; and a display 509a.

Detecting section

The detecting section includes an electron gun 127 to emit electrons; an electromagnetic type focusing lens 128 to thinly focus an electron beam 144 generated from the electron gun 127; an electromagnetic type deflector 129 to two-dimensionally scan the electron beam on the X-ray mask; an electromagnetic type objective lens 130 to focus an image; regulating (adjusting) movable aperture 131 to converge the electron beam 144; a secondary electron detector 135 for capturing the secondary electrons generated from the X-ray mask 200 and converting into the electric signal; an electron gun controller 132 to control the emission of the electrons from the electron gun 127; a lens controller 133 to control the currents of the electron gun of the electron beam 144 and of the focusing lens 128 and objective lens 130 for performing the focusing operation and the like; a deflector controller 134 to control the deflector 129 to two-dimensionally scan the electron beam 144; an SEM image display controller 39 for amplifying the signal of the secondary electrons and displaying as an SEM image; and a display 509b.

Among those components, the electron optical system and stage are enclosed in a vacuum chamber 112 which was exhausted to a vacuum degree of $10^{-6}$ Torr or less by a vacuum pump and, further, they are mounted on a fixed plate 121.

Positioning section

The positioning section (image processing apparatus) 519 includes, an SEM image memory 182 to store the video signal by the secondary electrons of the detecting section as an SEM image; an SIM image memory 183 to store the video signal by the secondary electrons of the ion beam working section as an SIM image; a position deciding circuit 192 to decide the defective position by using the signals which are obtained from the memories 182 and 183; a display 191 to display the image in which the defect obtained from the position deciding circuit 192 is shown; a positioning device to designate the defective position from the image displayed on the display 191; and a positioning controller 181 to control the respective components in the positioning section. The position deciding circuit 192 is made up of, an SEM image binarizing circuit 84 and an SIM image binarizing circuit 185 to binarize the signals obtained from the SEM image memory 182 and SIM image memory 183; an SEM image edge detecting circuit 186 and an SIM Image edge detecting circuit 187 to detect the edges of the worked hole from the images based on the binarized signals; a positioning circuit 188 to correct the positional deviation between the SEM and SIM images on the basis of the detected edges; and a superposing circuit 189 for superposing the SEM and SIM Images, thereby obtaining the image in which the defect is displayed.

Operation

The operation will now be described.

Figure 15:
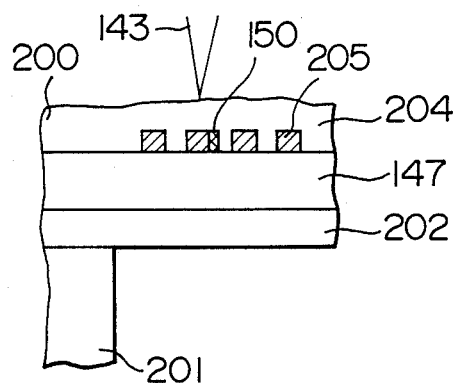
FIG. 15 is a cross sectional view showing an X-ray mask to be worked.

As shown in FIG. 15, the X-ray mask 200 to be worked includes the protective film 204 having a thickness of 3 $\mu$m; the Au pattern 205 having a width of 0.5 $\mu$m and a thickness of 1 $\mu$m and capable of absorbing the X-ray; a cushioning material 47 having a thickness of 2 $\mu$m; the supporting film 202 made of BN; and the supporting frame 201 made of Si.

The minimum size of a defective portion 150 of the Au pattern is 0.1 $\mu$m.

Figure 17:
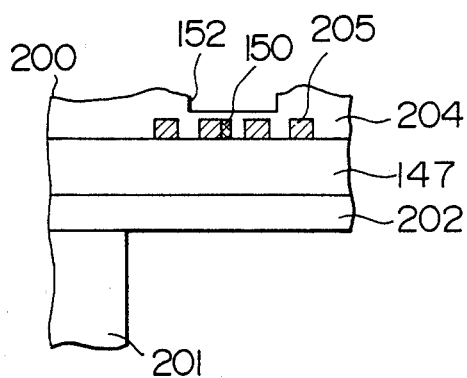
FIG. 17 is a cross sectional view showing an example of the working of an X-ray mask according to the invention.

First, the protective film 204 is worked to detect the Au pattern. The working position is set by moving the X stage 108 and Y stage 99 on the basis of the position information derived when the defect is detected. However, it is difficult to accurately set the working position to the defective portion of the Au pattern 205 due to the positioning precision of the X and Y stages, setting error of the X-ray mask to the stages, or the like. In addition, the shape of defect is not known. Therefore, when the polyimide protective film 204 is worked, its size is set to a value which is several times as large as the pattern width as shown in FIG. 17, that is, it is set to a square size of about 3 $\mu$m. On the other hand, the working depth is set to 1.8 $\mu$m since the dimensions of the surfaces of the protective film and Au pattern are set to 2 $\mu$m.

The working is performed by the ion beam 143. The ion beam 143 is generated by applying a high voltage of a few kilovolts between the ion source 501 and the extraction electrode 516. The ion beam is then focused to a diameter of about 0.5 $\mu$m by the lens electrode 503 and irradiated onto the surface of the X-ray mask 200. The beam diameter is set to about 0.5 $\mu$m when the protective film 204 of the X-ray mask is worked and to about 0.1 $\mu$m when the SIM image is obtained and when the defective portion 150 is worked. This is because in the case of working polyimide of the protective film 204, the sputtering rate of polyimide is smaller than that of Au, the working volume is large, and a high working accuracy is not necessary. The beam diameter is adjusted by changing the diameter of aperture (not shown) arranged at the central position among the lens electrodes 503 (FIG. 14). When the ion beam 143 is scanned by the deflector 505, the deflector controller 126 is set so that the scanning range is set to a square of 3 $\mu$m. The end point of the working of the protective film 204 is set such that the protective film 204 of a certain thickness remains so as not to work the Au pattern. Thus, the working precision within a range of ±10% is permitted and the working is made easy as compared with the case of perfectly eliminate the protective film 204. For instance, when the beam current value is set to a constant value, the working amount (working depth in this case) is proportional to the working time, so that the working end point can be detected by the working time.

The deflector controller 126 is set so as to scan the ion beam 143 within a range of the size which is about twice as large as that upon working around the working hole of the protective film 204, for example, to the range of a square of 6 $\mu$m after completion of the working of the protective film 204. The diameter of the ion beam 143 is set to 0.1 $\mu$m. The ion beam 143 is scanned by the deflector 505. The secondary electrons generated from the surface of the X-ray mask are captured by the secondary electron detector 508 and converted into the electric signal and amplified. The luminance is changed on the display 509a synchronously with the deflection of the ion beam by the SIM image display controller 137, thereby obtaining the SIM image. At the same time, the SIM image is stored into the SIM image memory 183 in the positioning section. At this time, although the portion of the SIM image (FIG. 18F) corresponding to the protective film of a worked hole 156 is pale, the image of the Au pattern cannot be obtained. On the surface of the protective film of the working hole 156, convex and concave portions 159 by the circuit pattern on a protective film 158 existing before the working are eliminated by the working. Thus, the slight contrast of the edges of the Au pattern which existed before the working is also extinguished. On the contrary, since the convex and concave portions 159 by the circuit pattern on the protective film 158 after the working are eliminated, the luminance of edges 157 of the worked hole is detected as a high value when it is observed from the whole SIM image.

Next, the moving table 515 on which the X-ray mask 200 is mounted is moved to the detecting section. At this time, if the optical axes of the ion beam optical system and electron beam optical system are made coincident, the working portion of the X-ray mask can be moved below the electron beam optical system at the luminance of 1 μm or less by setting the feeding amount of the moving table to a constant value with the X stage 108 and Y stage 99 fixed.

Figure 18A:
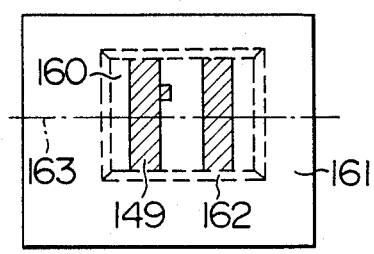
FIGS. 18A to 18I are diagrams for explaining the processes of a position deciding circuit shown in FIG. 14.

In the detecting section, the electrons generated from the electron gun 127 are focused by the focusing lens 128 and objective lens 130. The focused electron beam 144 is deflected by the deflector 129 and two-dimensionally scanned on the X-ray mask 200. At this time, the deflector controller 134 is preset so as to set the scanning width to the same value of the square of 6 μm as that in the case of obtaining the SIM image. The secondary electrons generated from the surface of the X-ray mask 200 are captured by the detector 135 and converted into the electric signal and amplified. The luminance on the display 509b is changed synchronously with the deflection of the electron beam by the SEM image display controller 139, thereby obtaining the SEM image. At the same time, the SEM image is stored into the SEM image memory 182 in the positioning section. As shown in FIG. 18A, the shapes of the Au pattern 149 and a defective portion 160 under the thin protective film are reflected to the SEM image at this time because the electrons of the scanning electron beam deeply enter the X-ray mask to be worked as compared with the ions of the ion beam. However, since a protective film 161 around the hole is thick, the Au pattern under this protective film cannot be detected similarly to the case of the SIM image. On the other hand, the edge portion of the worked hole is detected as a high luminance image similarly to the case of the SIM image.

Figure 18F:
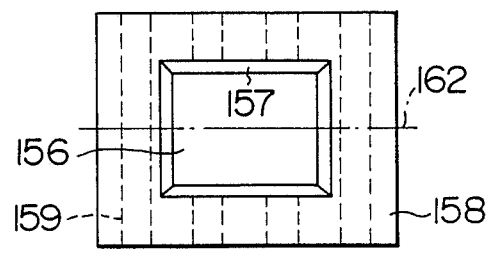

Next, in accordance with an instruction from the positioning controller 181 (FIG. 14) in the positioning section, the SIM and SEM image binarizing circuits 185 and 184 in the position deciding circuit 192 obtains the binarization images of the SIM image of FIG. 18F and SEM image of FIG. 18A by use of the image data in the SIM and SEM image memories 183 and 182 in which those SIM and SEM images are stored.

Figure 18B:
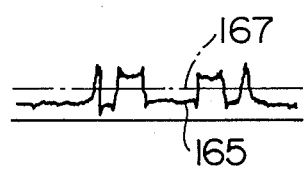
Figure 18G:
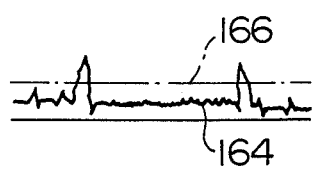
Figure 18C:
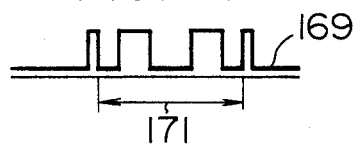
Figure 18H:
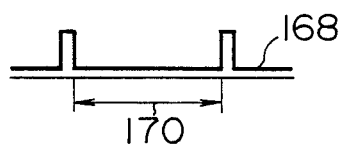
Figure 18D:
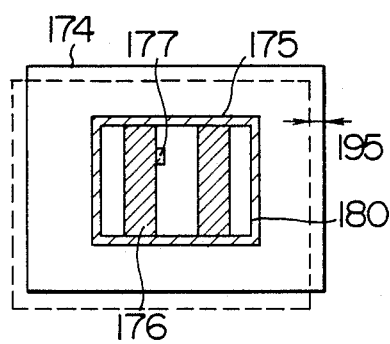
Figure 18I:
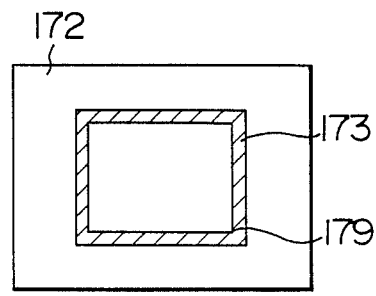

A luminance level 164 (FIG. 18G) of one scanning line 162 of only the edge portion 157 of the worked hole is high for the SIM image of FIG. 18F. Therefore, a binarization level 168 (FIG. 18H) which is set to "1" for only the edge portions and to "0" for the other portions is derived. Thus, the binarization image as shown in FIG. 18I is derived from the SIM image binarizing circuit 185. On the other hand, a luminance level 165 (FIG. 18B) of one scanning line 163 corresponding to each of an edge 170 of the worked hole of the protective film and the Au pattern 149 and defective portion 160 in the worked hole is high for an SEM image 161 of FIG. 18A. Therefore, a binarization level 169 (FIG. 18C) which is set to "1" for only the edge portion 170 and the portions of the Au pattern 149 and defective portion 160 in the worked hole and to "0" for the other portions is derived. Thus, the binarization image as shown in FIG. 18D is obtained from the SEM image binarizing circuit 184 (FIG. 14). There are several methods of setting binarization reference levels 166 and 167 (FIGS. 18G and 18B) which are used to binarize by the SIM and SEM image binarizing circuits 185 and 184. In this case, the luminance levels 164 and 165 relate to the edge portions, the maximum value substantially corresponds to the upper side of the worked hole, and the minimum value substantially corresponds to the lower side of the worked hole, respectively. Therefore, each of the binarization reference levels 166 and 167 is set to the intermediate value between the maximum and minimum values.

Next, edges 171 and 170 of the worked hole are detected from the binarized images 169 (174) and 168 (172) by the SEM image edge detecting circuit 186 (FIG. 14) and SIM image edge detecting circuit 187. The edges are set to edge lines 179 and 180 on the inside of the edge portions 173 and 175 of the binarized images as shown in FIGS. 18I and 18D. Although there is a case where the distances of the edge lines 179 and 180 differ depending on the SIM and SEM images, the process in such a case is executed by the following positioning circuit 188.

The positioning circuit 188 (FIG. 14) calculates the deviation amount when the edge line 179 of the SIM image of FIG. 18I and the edge line 180 of the SEM image of FIG. 18D overlap (unless they overlap, the distance becomes the minimum). This deviation amount corresponds to a deviation 195 of the SEM image of FIG. 18D to the SIM image of FIG. 18I. Reference numeral 176 denotes a binarized image of the Au pattern and 177 represents a binarized image of the defective pattern.

Figure 18E:
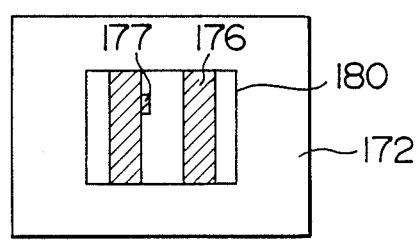

In the superposing circuit 189 (FIG. 14), only the inside portion of the edge line 180 is extracted from the binarized SEM image 174 of FIG. 18D and moved by only the deviation amount 195 calculated by the positioning circuit 188 and superposed to the binarized SIM image 172 of FIG. 18I, thereby obtaining the superposed image 172 (FIG. 18E). In this case, the processes have been made with regard to the binarized SIM image 168 (172) and binarized SEM image 169 (174). However, only the inside portion of the edge line of the SEM image of FIG. 18A can be also superposed to the SIM Image of FIG. 18F before binarization. If the image before the binarization was superposed, the positioning to defect can be performed by the next positioning device by use of the image before the binarization.

The positioning device 190 (FIG. 14) then displays the image obtained from the superposing circuit 189 onto the display 191, designates the defective portion by a cursor line or the like, and indicates the working range to the deflector controller 126.

Figure 19:
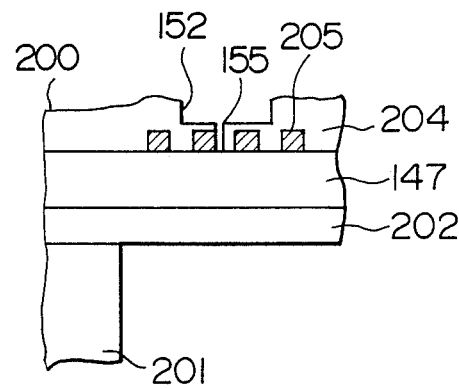
FIG. 19 is a cross sectional view showing the result of the working due to an X-ray mask.

The moving table 515 on which the X-ray mask 200 is mounted is again moved to the ion beam working section. At this time, the moving amount is the same as the moving amount when the moving table was moved from the ion beam working section to the detecting section. In the ion beam working section, the diameter of the ion beam is set to 0.1 μm, the ion beam is scanned within the range designated in the deflector controller 126, and only a defective portion 155 of the Au pattern can be worked and eliminated as shown in FIG. 19.

According to the embodiment, the Au pattern under the protective film which cannot be detected by only the SIM image derived by the ion beam working section is detected by the SEM image in the detecting section and superposed to the SIM image, thereby enabling the defective position to be determined and also enabling only the defect to be worked and eliminated.

Figure 16:
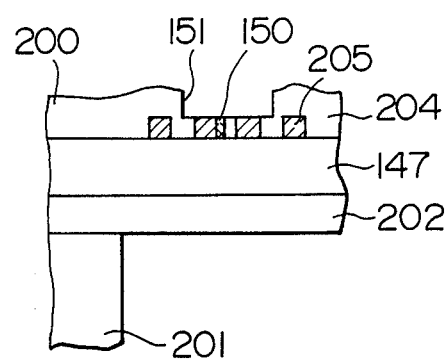
FIG. 16 is a cross sectional view showing an example of the working of an X-ray mask.

That is, according to the embodiment, the defective portion 150 of the fine pattern 205 under the protective film 204 as shown in FIG. 15 can be worked. In detail, instead of working as shown in FIG. 16, as shown in FIG. 17, the pattern 205 and defect 150 under the thin protective film 204 obtained by forming a hole 151 by the ion beam 143 with a part of the protective film 204 remained are detected by the scanning electron microscopic image and the detected image is superposed to the scanning ion image, thereby positioning the defective portion 150 of the pattern and enabling only the defective portion of the pattern to be accurately and precisely worked. There is an advantage such that the fine pattern which cannot be detected by the optical microscope can be detected and worked without any damage of the pattern due to the focused ion beam associated with the detection of the pattern.

As described above, according to the present invention, the defect of the circuit pattern of the X-ray mask having the protective film on the top layer can be corrected by the ion beam and a large economical advantage can be derived.

We claim:

1. A method of correcting defects of an X-ray mask comprising the steps of:

forming a layer of stopping material on top of a circuit pattern of an X-ray mask having a flat surface wherein the X-ray mask further includes a protective film on said flat surface and wherein the stopping material has a lower sputtering rate than the protective film;

irradiating with a focused ion beam a selected region of the X-ray mask having at least a defective portion wherein irradiating with the focused ion beam eliminates said protective film;

exposing from the protective film the stopping material located on top of the circuit pattern having the defective portion located under said region wherein such exposing causes a difference in level of material removed between the stopping material and the protective film;

detecting at least one of secondary electrons, secondary ions, reflected electrons, and absorbing current generated from said region having the defective portion thereby detecting a true defective position;

positioning said focused, ion beam to said true defective position; and irradiating only the defective portion with the focused ion beam to thereby correct the defective portion.

2. The method according to claim 1, wherein the protective film is eliminated by the irradiating of the focused ion beam to a depth detected by detecting an absorbing current.

3. The method according to claim 1, wherein the correction of the defect is performed by methods such as ion beam CVC, and ion beam deposition.

4. The method according to claim 3, wherein said circuit pattern is exposed or set to the state near the exposure by detecting the absorbing current to the X-ray mask.

5. The method according to claim 3, wherein the correction of the defect is performed by methods such as ion beam CVD, and ion beam deposition.

6. The method of claim 1, wherein the protective film is eliminated by the irradiating of the focused ion beam to a depth dependent upon a detected elapsed working time.

7. A method of correcting defects of an X-ray mask comprising the steps of:

irradiating with a focused ion beam at least a region having a defective portion of an X-ray mask a flat surfaced having a protective film and eliminating said protective film;

exposing from under the protective film a circuit pattern having a defective portion located under said region or setting the circuit pattern to a state near the exposure;

picking up an image of said region by a scanning electron microscope and detecting a true defective position;

positioning the focused ion beam to said true defective position;

irradiating the defective portion with the focused ion beam; and correcting the defect.

8. A method of correcting defects of an X-ray mask having a protective film covered flat surface comprising the steps of:

irradiating with a focused ion beam an X-ray mask having a fine pattern covered by a protective film while scanning the focused ion beam, and eliminating a part of said protective film;

irradiating with an electron beam the X-ray mask a part of which was eliminated while scanning the electron beam, and extracting an image signal of the fine pattern covered by the protective film;

irradiating with the focused ion beam the X-ray mask a part of which was eliminated while scanning the focused ion beam, and extracting an image signal of the X-ray mask; and combining said two kinds of image signals and working the defective portion of the fine pattern.

9. The method according to claim 8, wherein the protective film is eliminated by the irradiating of the focused ion beam to a depth detected by an elapsed working time.

10. The method of claim 8, wherein the protective film is eliminated by the irradiating of the focused ion beam to a depth dependent upon a detected absorbing current.

11. A method of correcting defects of an X-ray mask having a flat surface with a protective film on said flat surface comprising the steps of:

forming a protective film on a circuit pattern of the X-ray mask flat surface;

eliminating by irradiating with an ion beam, an area of the protective film wherein the area eliminated has a width larger than a defective portion of the circuit pattern and a depth which does not expose the circuit pattern under the protective film;

applying an electronic beam to the X-ray mask in order to obtain a first image of the X-ray mask, wherein the first image includes the area of the protective film which has been eliminated, the circuit pattern, and the defective portion of the circuit pattern located within the area of the eliminated protective layer;

applying an ion beam to the X-ray mask in order to obtain a second image of the X-ray mask wherein, the second image includes the area of the protective layer which has been eliminated;

superimposing the first and second images to obtain a precise location of the defective portion;

focusing the ion beam on the precise location of the defective portion;

irradiating with the ion beam only the defective portion to thereby correct the defect; and filling in the area of the protective film eliminated.

* * * * *

UNITED STATES PATENT AND TRADEMARK OFFICE
CERTIFICATE OF CORRECTION

PATENT NO. : 4,933,565

DATED : June 12, 1990

INVENTOR(S) : Hiroshi Yamaguchi, et al.

It is certified that error appears in the above-identified patent and that said Letters Patent is hereby corrected as shown below:

Claim 7, column 14, lines 2-3, please delete "an X-ray mask a flat surfaced" and insert therefor --a flat surfaced X-ray mask--.

Signed and Sealed this

Twenty-first Day of May, 1991

Attest:

HARRY F. MANBECK, JR.

Attesting Officer

Commissioner of Patents and Trademarks

UNITED STATES PATENT AND TRADEMARK OFFICE
CERTIFICATE OF CORRECTION

PATENT NO.  : 4,933,565
DATED       : June 12, 1990
INVENTOR(S) : Hiroshi Yamaguchi, et al.

Figure 14A:
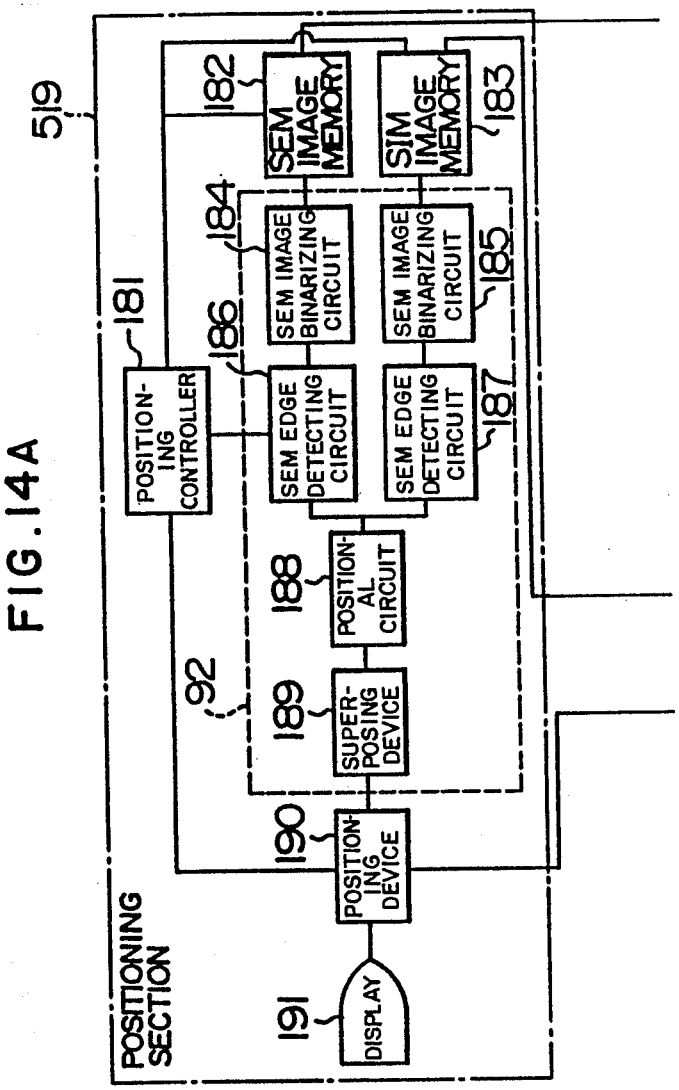
FIG. 14 is a whole arrangement diagram showing further practically the apparatus shown in FIG. 10.
Figure 14B:
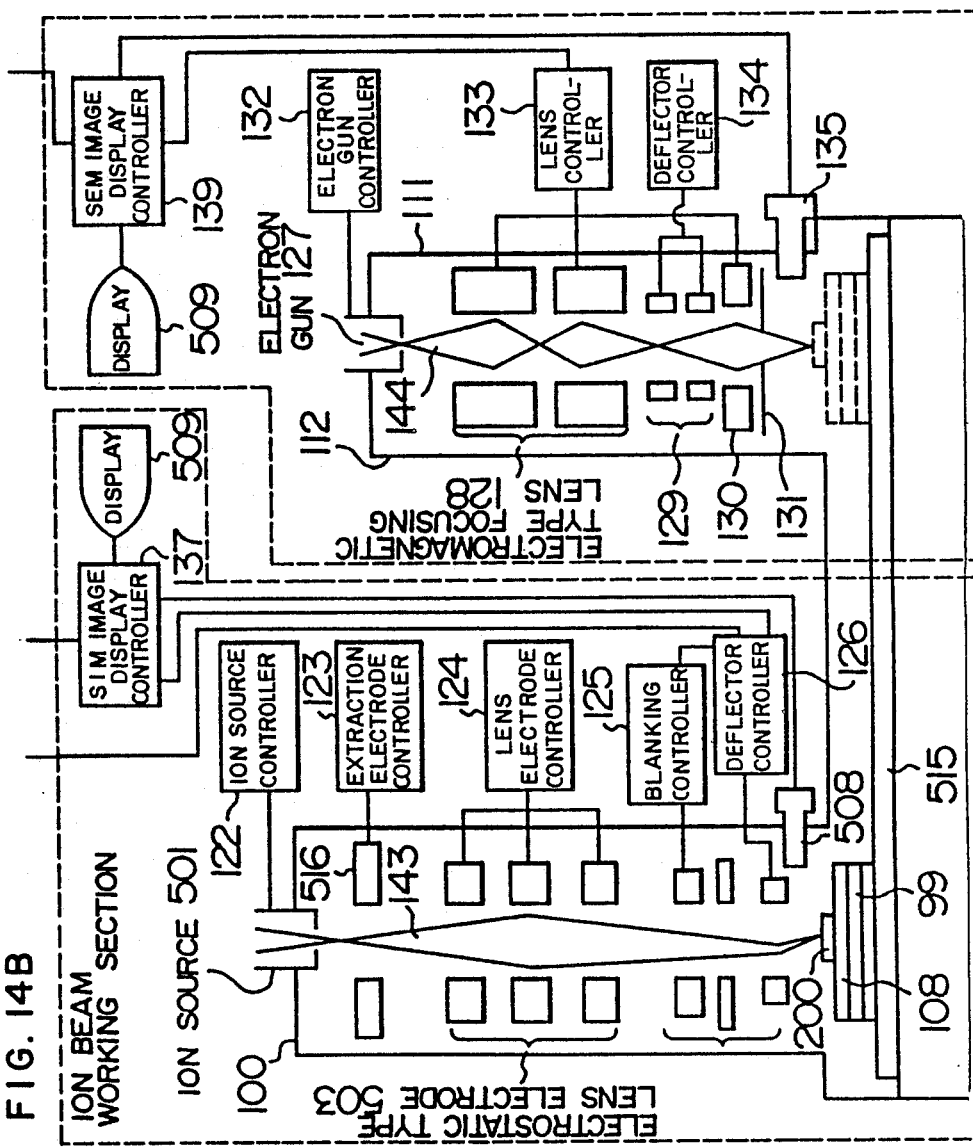

It is certified that error appears in the above-identified patent and that said Letters Patent is hereby corrected as shown below:

Column 4, line 62, delete "FIG. 14 is" and insert therefor --FIGS. 14A and 14B comprise--.

Column 8, lines 27 and 28, delete "FIG. 14" and insert therefor --FIGS. 14A and 14B--.

Column 11, line 43, delete "14" and insert therefor --14A--.

Column 12, lines 22, 32, and 47, delete "14" and insert therefor --14A--.

Signed and Sealed this

Third Day of November, 1992

Attest:

DOUGLAS B. COMER

Attesting Officer

Acting Commissioner of Patents and Trademarks